United States Patent [19]
Azotea et al.

[11] Patent Number: 6,060,795
[45] Date of Patent: May 9, 2000

[54] SEMICONDUCTOR POWER PACK

[75] Inventors: James K. Azotea, Saratoga Springs; Steve Arthur, Glenville, both of N.Y.; Homer Glascock, Millis, Mass.

[73] Assignee: Intersil Corporation, Palm Bay, Fla.

[21] Appl. No.: 09/040,112

[22] Filed: Mar. 18, 1998

[51] Int. Cl.⁷ ..................................................... H02J 7/00
[52] U.S. Cl. .......................... 307/150; 361/688; 361/717; 257/680
[58] Field of Search ............................... 307/150, 98, 89; 361/688, 704, 707, 717–722; 257/701, 703, 704, 706, 712, 713, 700, 686

[56] References Cited

U.S. PATENT DOCUMENTS

| | | | |
|---|---|---|---|
| 4,710,795 | 12/1987 | Nippert et al. | 357/65 |
| 4,731,644 | 3/1988 | Neidig | 357/72 |
| 4,839,717 | 6/1989 | Phy et al. | 357/74 |
| 5,003,370 | 3/1991 | Kashiwagi | 357/39 |
| 5,016,138 | 5/1991 | Woodman | 361/381 |
| 5,166,773 | 11/1992 | Temple et al. | 257/678 |
| 5,574,312 | 11/1996 | Bayerer et al. | 257/706 |
| 5,702,985 | 12/1997 | Burns | 437/217 |
| 5,726,466 | 3/1998 | Nishitani | 257/181 |
| 5,768,104 | 6/1998 | Salmonson et al. | 361/704 |

*Primary Examiner*—Stephen W. Jackson
*Assistant Examiner*—Peter Zura
*Attorney, Agent, or Firm*—Rogers & Killeen

[57] ABSTRACT

A power pack for providing power electronics at high temperature with high dI/dt, current, and voltage capability. The power pack having three layers. A top layer for providing: a matching composite Coefficient of Thermal Expansion (CTE) between power device materials and power electrodes, thermal cooling, and electrical conduction paths. The top layer may have interface circuitry for driving and controlling on-board power semiconductor devices. The top layer may also include traces and pads for the attachment of a gate, a gate return, and terminals. A middle layer may be a power semiconductor device providing control of the current flow. The bottom layer may be a rigid base plate for providing structural rigidity or may provide an electric and thermal path for the power semiconductor device. The power pack also includes a thermal shim which provides a thermal path to dissipate heat generated by the interface circuitry. The power pack may also include a snubber circuit.

89 Claims, 14 Drawing Sheets

SNUBBER IN
POWER CIRCUIT

Physical Component Layout

ELECTRICAL EQUIVALENT CIRCUIT

SEMICONDUCTOR POWER PACK

BACKGROUND OF THE INVENTION

This invention relates to power packs, and more particularly to highly modular semiconductor power packs.

A power pack is a switching unit that converts the available electrical power to voltage and current values required by a unit of electronic equipment. In today's growing electronic industry, there is a great demand for low profile, low inductance, highly modular, and thermally efficient power packs. The demand may be greatest in the power electronics industry where power packs handle high voltage and high current applications. Further, today's consumer and industrial power electronics applications demand high temperature, high frequency, modular, light weight, and low profile equipment having a construction which is suitable for mass production. These applications include AC switches, motor drives, and multiple phase inverters.

Prior art devices provide power semiconductor power packs having a top lid, base plate, and power semiconductor device which is sandwiched between the lid and plate. In the prior art, the lid and power semiconductor device are attached using duck feet or copper balls to allow electrical conduction through the lid. Additionally, the prior art includes power packs having a driver circuit stacked on the power semiconductor device between the lid and base plate. These devices do not provide an isolated cooling for the driver circuit, parallel cooling for the driver circuit and power semiconductor device, extremely low thermal resistance for the power semiconductor device and driver circuit, simple interface capability, two sided cooling, and the capability of being stacked and interconnected to form larger more complex power packs.

Accordingly, it is an object of the present invention to provide a novel highly modular semiconductor power pack that operates at elevated temperatures near 100 degrees Celsius.

It is another object of the present invention to provide a novel power semiconductor switch having improved thermal management.

It is yet another object of the present invention to provide a novel semiconductor power pack having a power semiconductor device, driver circuit, and thermal management for the driver circuit and power semiconductor device.

It is still another object of the present invention to provide a novel low volume low cost power pack for high frequency and high temperature applications.

It is a further object of the present invention to provide a novel thin stackable power pack having an on-board driver circuit and isolated thermal management for the driver circuit.

It is yet a further object of the present invention to provide a novel universal power pack having self-contained thermal management and electrically isolated control.

It is still a further object of the present invention to provide an improved power semiconductor pack having a power semiconductor switch sandwiched between thermal management and electrical conduction layers and having driver circuitry and thermal management means for the driver circuitry affixed to the sandwich layers.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
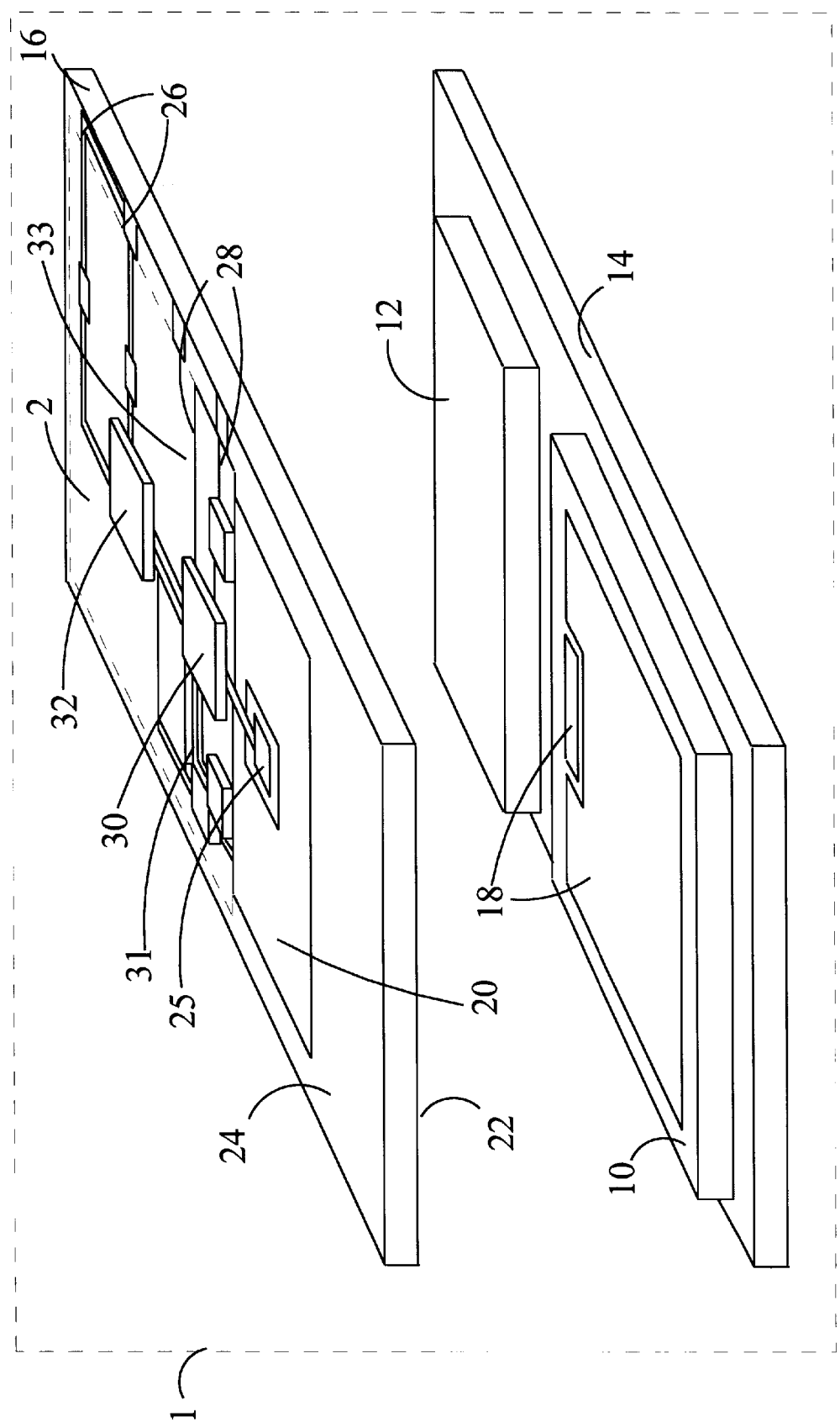
FIG. 1 is a perspective view of a power pack illustrating an embodiment of the present invention.

With reference now to the embodiment of the present invention illustrated in FIG. 1, the power pack 1 includes a power semiconductor device 10, a thermal shim 12, a base plate 14, and a lid 16 having metalized feedthrough holes (vias) 20 and an interface circuit 2. Plated holes and vias are discussed as having substantially the same meaning. In practice, the feedthrough holes 20 may be considered to be a part of the interface circuit 2. The power semiconductor device 10 has active contact regions 18 which are bonded directly to the inner surface of the lid 22. The plated holes 20 are aligned with and are bonded to the active contact regions 18. The holes 20 provide an electrical path for the operation of the power semiconductor device 10.

The lid 16 is preferably a high temperature circuit board (HTCB). The HTCB substrate is preferably made of a low thermal resistance material such as a ceramic (e.g., Beryllia, Alumina, and Aluminum Nitride). To manufacture a High Temperature Circuit Board (HTCB), holes are first formed in the ceramic substrate by lasers or other method known in the art. Next, the surfaces of the substrate, including the interior of the holes, are metalized and patterned. The metal can be Copper, Gold, Nickel, Silver, Aluminum, Molybdenum, Tungsten, or a combination of the metals listed. The surface can be metalized using methods known in the art such as Direct Bond Copper (DBC), lamination of metal, sputtering of metal, and evaporation of metals. Other methods of metalization include DBC of properly treated Aluminum Nitrite (oxidized ALN ceramic) substrate and using an electroless Nickel plate in combination with a copper electroplate. The preferred method of metalization is DBC by electroplate in which:

(1) electroless plate copper is deposited on the ceramic which, by a commonly used electroless plate process, has an oxidized layer formed on the substrate's surface that is usable in a DBC process;

(2) electroplate copper is deposited on the electroless plate copper;

(3) gas release openings in the electroplated metal are provided to shorten the gas release distance and reduce "blistering" or de-lamination of the electroplated copper from the substrate during a DBC process;

(4) remove excess copper oxides from the top of electroplated copper;

(5) process the substrate with a DBC method.

The metal surfaces can be patterned using methods known in the art such as photomask and etching. The electroplate and DBC by electroplate produces smooth metalized surfaces that can be patterned into intricate geometry and provides a flat and uniform solder interface that is excellent for solder bonding. This is an improvement over the prior art lid-to-device attachment methods such as "duck feet" or copper balls. With the DBC-electroplate method, back filled copper and copper-solder vias (holes) are manufacturable in the lid; which improves the electrical and thermal resistance of lids. The thermal resistance of a low cost lid material having low thermal conductance such as Alumina (Al2O3) with a k=35, may be greatly improved with multiple back filled copper and copper-solder vias. The improved thermal performance of the power switch is mainly due to the increased surface area contacted by the power semiconductor device 10, the high thermal conductivity of the lid 22, and the low thermal conductivity of the surfaces attaching the cooling system. The improved electrical performance is mainly due to: low inductance electrode connections (strip line), multiple holes with low resistance, spacing of holes to decrease mutual inductance, and a combination of hole spacing and strip line connection to reduce the total package inductance. The DBC by electroplate method allows the stacking of both discrete and modular power devices in series, parallel, and series-parallel operation and allows the direct attachment of the active area of a power semiconductor device to the under side of the lid.

The interface circuit 2, shown in FIG. 1, provides an interface for connecting and controlling the power semiconductor device 10 with external equipment (not shown). The interface circuit 2 includes a driver circuit 30 which is used to drive the power semiconductor device 10. The interface circuit further includes an isolated control circuit 32 for receiving control commands from external equipment (not shown). The commands may be received (as shown) by the control circuit 32 on input control paths 26. The isolated control circuit 32 implements the control commands through communication with the driver circuit 30 (circuit 30 is hard-wired to circuit 32). The driver circuit 30 output is connected to gate pad 25 which drives the power device gate metalization 18. The control circuit 32 may be comprised of an opto-coupler or a fiber optic receiver. The interface circuit 2 can be wired from the input control paths 26 (e.g., bypassing the driver circuit 30 and 32 but using "on lid" damping resistors) to the gates of the power semiconductor device (e.g., the gate and gate return of a MOS controlled thyristor). Direct wiring can be provided using the metalized feedthrough holes 20. Power source paths 28, of the interface circuit 2, supply power to the "active" control circuitry on power pack 1. The bias 33 or damping 31 resistors, made with thick film resistor material, are screened with up to five different values of resistivity and thickness. Geometry's of the traces for the bias resistor 33 and pads for the damping resistor 31 are sized for power dissipation and resistance value. Resistance design calculations are easily made with the formula R=(p*l)/A where "R" is the desired resistance, "p" is resistivity, "l" is length and "A" is the cross-sectional area.

The interface circuit can be manufactured on the lid using thick film resistor technology or surface mount technology. The interface circuit pads and traces may be manufactured by screening Palladium-Silver ink and curing at high temperature (Palladium-Silver process), by a Palladium-Silver process with solder reflow coating, by an electroless plate (catalyst 9F bath) in combination with copper electroplate, or methods used for metalizing the ceramic substrate (i.e., DBC, DBC by electroplate, and electrode less Nickel plate in combination with copper electroplate).

The base plate 14 may be made of a copper-molybdenum-copper composite, Beryllium Oxide (BeO), Aluminum nitride (AlN), or thin copper. The base plate materials provide structural rigidity and a contact for the power semiconductor device 10. Generally, the material of the base plate is selected to have high thermal conductivity and low cost of manufacture. Chemical machining may be used on the base plate to etch alignment areas for both the power semiconductor device 10 and the thermal shim 12. The power semiconductor device 10 and the thermal shim 12 are bonded directly onto the base plate 14. Alternatively, the base plate 14, like the lid, may be made of a low thermal resistance material with metalized holes as contacts (e.g., a High Temperature Circuit Board (HTCB)). In such case, two lids sandwich the device 10 and shim 12. This "two lid" configuration provides top side, bottom side or two-sided cooling.

The thermal shim 12 provides thermal management for the control interface circuit 2. The thermal shim 12 is preferably made of a low thermal resistance material such as Copper-Molybdenum-Copper composite, ceramic, or silicon.

The power semiconductor device 10 may be a MOS controlled thyristor (MCT), Silicon Controlled Rectifier (SCR), Bipolar Junction Transistor (BJT), Power Diode, Insulated Gate Bipolar Transistor (IGBT), or other solid state semiconductor device having high voltage and current capacity. The thermal shim 12 mounted between the interface circuit 2 and base plate 14 provides an excellent thermal path to flow.

A design consideration in selecting materials for the lid, base plate, and shim is each material's coefficient of thermal expansion (CTE). The CTE of the devices must match such that during operation the physical heat flux of the interface circuit 2 and power semiconductor device 10 and the physical heat flux of the lid, shim and plate due to heat emanating from the electronic devices do not cause excessive stress and strain on the power pack or it's components. Methods for selecting materials with matching CTE are known in the art. These methods include the use of Shapery's Equation to predicate the composite Coefficient of Thermal Expansion (CTE) of materials.

Figure 11:
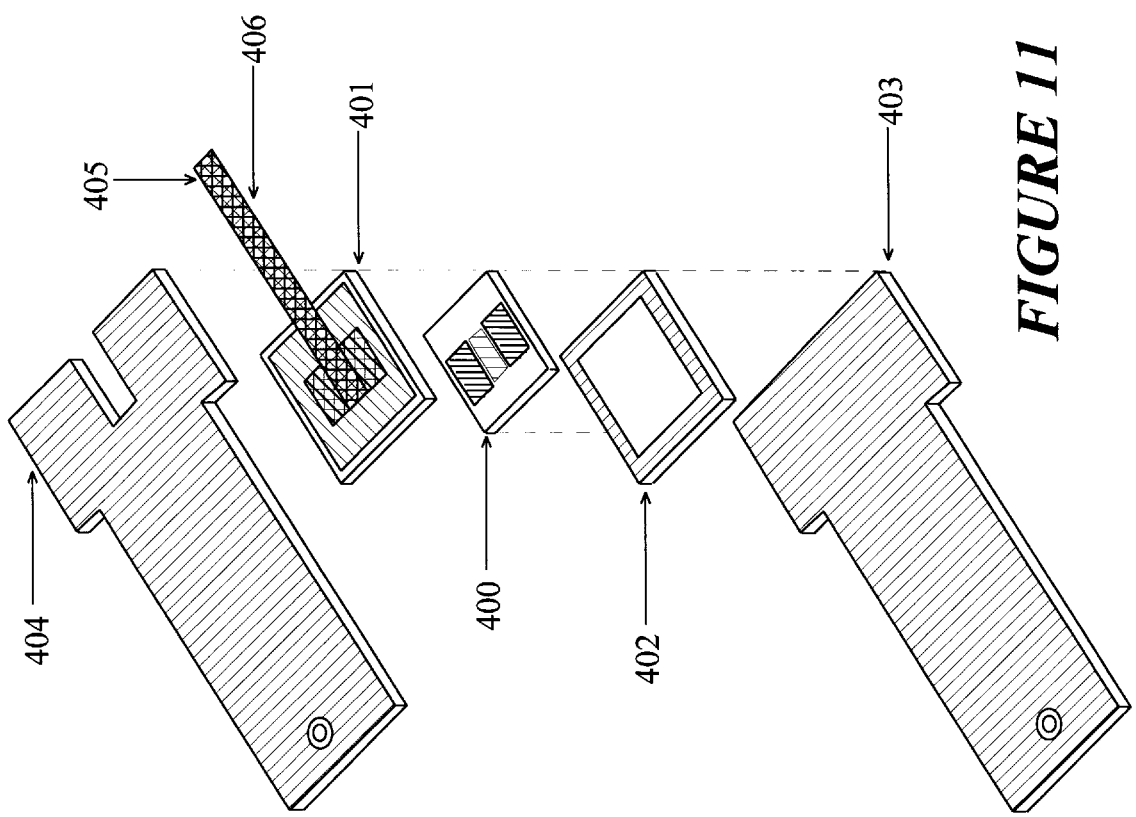
FIG. 11 illustrates a hermetic embodiment of the present invention.

A simple assembly procedure for the parts of FIG. 1 is as follows: solder tin under the power semiconductor device 10 and the thermal shim 12; place both solder tinned power semiconductor device 10 and thermal shim 12 in alignment areas; align the lid 16 with a fully tested interface circuit 2, on the tested power semiconductor device 10 and thermal shim 12; slide the assembled module on a "hot plate"; and subsequently, slide the heated assembly off the "hot plate" for cooling. The thermal shim 12 along with the power semiconductor device 10 are attached directly to the inner surface of the lid 22. The assembled power pack provides a hermetic seal between the power semiconductor device 10 and the lid 16. Hermeticity of a single power device is accomplished as illustrated in FIG. 11 by: a hermetic seal between the power semiconductor device 400 and the lid 401, a hermetic seal with the use of a seal ring located on the under side of the lid 401 to a "picture frame" 402 (CTE matched metalized ceramic or CTE matched metal), and a hermetic seal located between the bottom of the picture frame 402 and the top of the base plate 403. A non hermetic version can be manufactured with a low CTE plastic or epoxy picture frame or back filled with polyamide. Sealing is necessary to prevent contamination and arcing inside the package. The low inductance of the power package, shown in FIG. 11, is achieved by stripline power electrodes 403 and 404 and stripline gate and gate return connections 405 and 406.

The assembled power pack can be manufactured, tested, and repaired cost effectively. The lid is designed for automated vacuum testing of the local gate drive, opto-coupler and power device. The power pack having a power semiconductor device in combination with interface, driver, and control circuits provides an isolated power pack or module that can operate at higher temperatures and higher frequencies.

In operation, external equipment (not shown) control the operation of the power semiconductor device 10 by communicating with the interface circuit 2. The heat from the interface circuit is dissipated through the lid 16 and thermal shim 12 to the base plate 14. The heat from the operation of the power semiconductor device 10 is dissipated through the lid 16 and base plate 14. The cooling paths (i.e., heat dissipation paths) for the interface circuit 2 and power semiconductor device 10 are in parallel. Therefore, the interface circuit is thermally isolated from the power semiconductor device 10 through the parallel cooling paths.

The power dissipated by the thermal management structures of the power pack can be estimated with equations known in the art: $P=[(Tj-Ta)/Rth]=(C)(V)(V)(F)=(E)(F)$ and $Rth=t/(k)(A)$. Power estimation requires knowledge of energy (E), signal frequency (F), material thickness (t), area (A), peak to peak voltage (V), temperature difference (Tj−Ta) between ambient temperature and power switch junction temperature, and thermal conduction characteristics of the materials (k).

Figure 2:
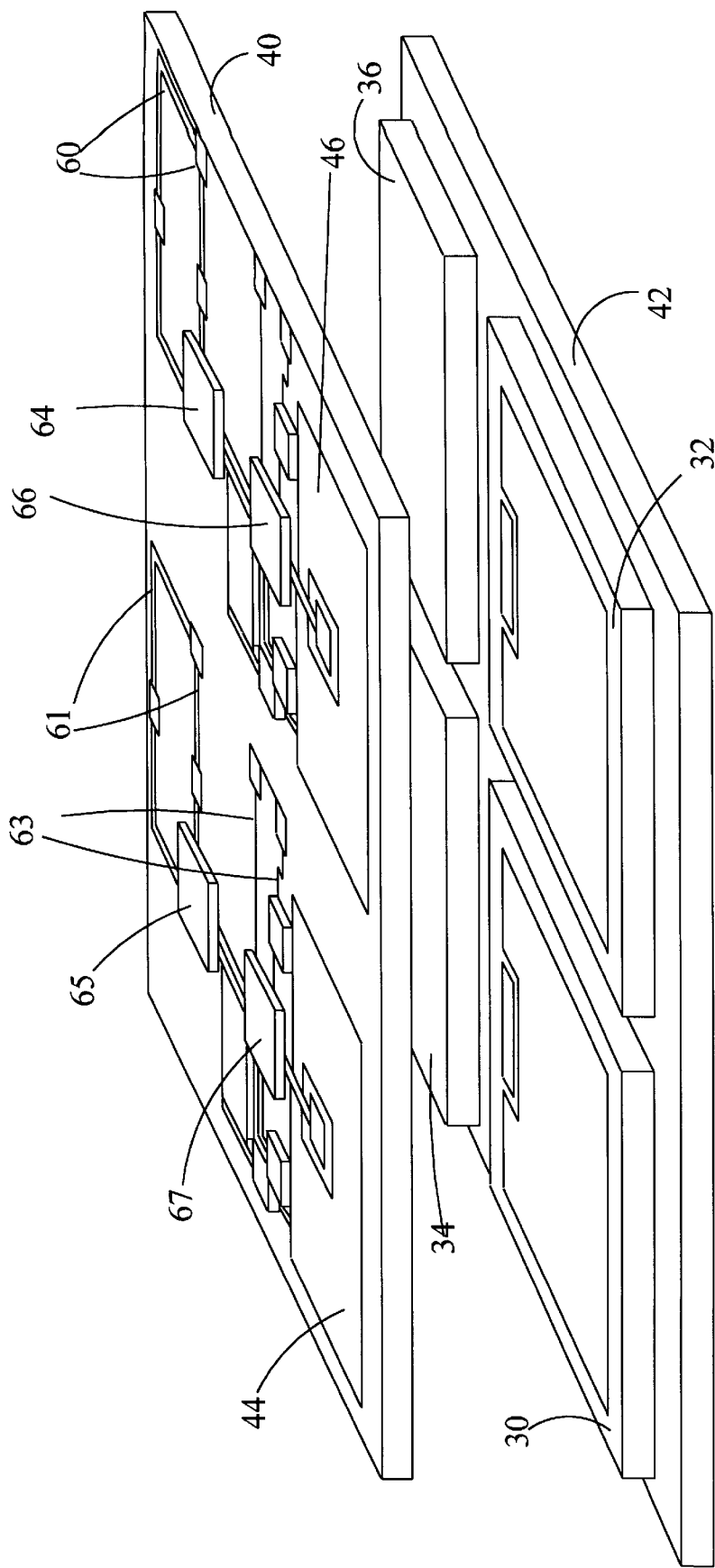
FIG. 2 is a perspective view of another power pack illustrating an embodiment of the present invention.

The power package array shown in FIG. 2 illustrates a half-bridge embodiment of the present invention. The half-bridge embodiment is assembled in a similar manner as the power pack of FIG. 1 using patterned metal on ceramic substrates to achieve power device isolation on the back side metalization. Tabs or stripline (not shown) can be attached to 44 and 46 to obtain independent "stripline" power packages. Thermal shims 34 and 36 are again mounted between the gate interface circuits and base plate 42 to provide an excellent thermal path for power to flow. Heat from each of the power semiconductor devices 30 and 32 can be taken off the top of the low thermal resistance lid 40 or through the silicon die of the power semiconductor devices 30 and 32 to the base plate 42. The power pack of FIG. 2 includes a first and second semiconductor power device 30, 32 and corresponding interface circuits. Feedthrough holes 44 and 46 provide isolated electronic paths from each interface circuit to its corresponding power semiconductor device 30 and 32. As in FIG. 1, each interface circuit includes control paths (60, 61), power supply paths (62, 63), a control circuit (64, 65), and a driver circuit (66, 67).

Figure 3:
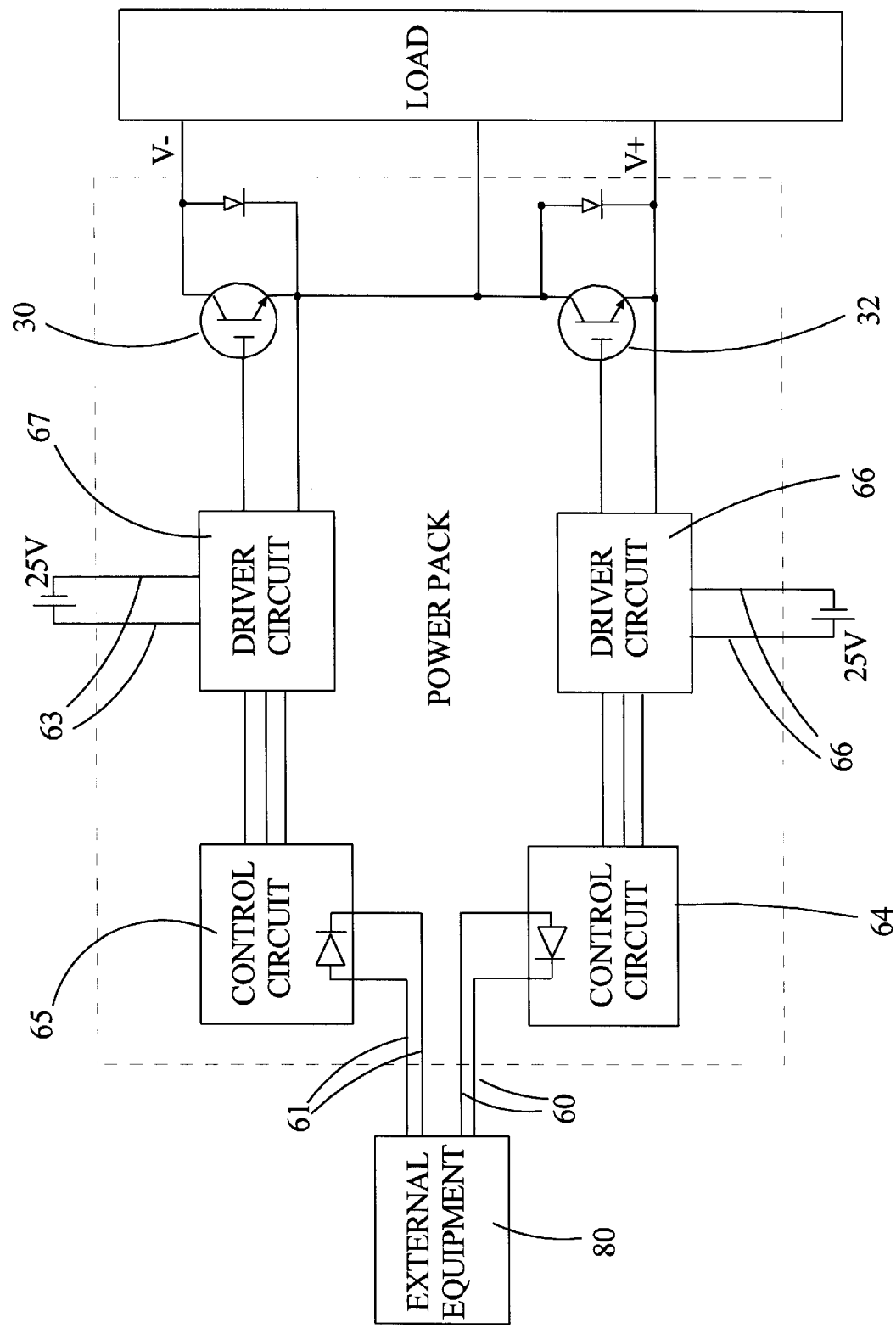
FIG. 3 is a circuit application block diagram of the power pack illustrated in FIG. 2.

FIG. 3 is a schematic circuit block diagram of the power pack illustrated in FIG. 2. Control circuits 64 and 65 are independently controlled through simple control commands from external equipment 80. The control circuits 64 and 65 trigger the driver circuits 66 and 67 to turn on or off the power semiconductor devices 30 or 32.

The flat surfaces of the lid and base plate provide surfaces for the stacking of power packs. Two power packs can be stacked with facing lids to allow interconnection between the power packs. Stacking may also be enhanced by the use of low inductance flat wiring "stripline" for connecting power packs to external electronics. These enhancements include high dI/dt operation, significant reduction in magnetic noise fluxes inside the module, decreases in the de-rating of Forward Breakdown Voltage (Bvf) of the power devices due to stray inductance (LdI/dt) inside the module during "turn off".

Figure 4C:
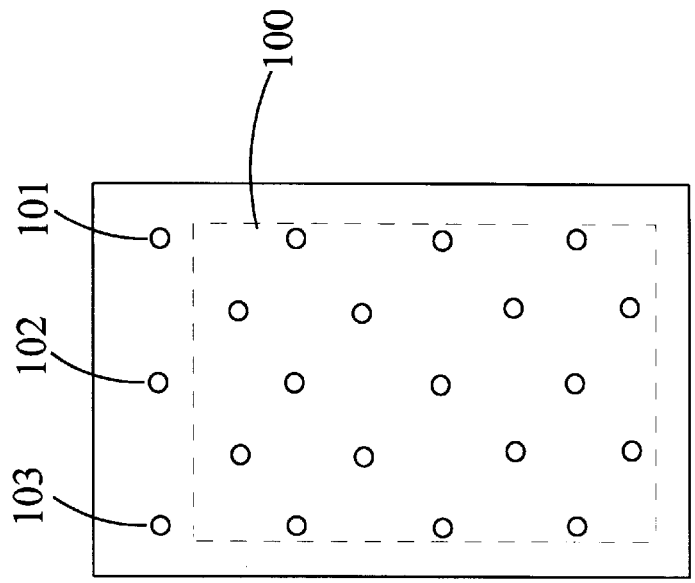
FIGS. 4a–4c illustrate a lid without interface circuitry for an embodiment of the present invention.
Figure 4B:
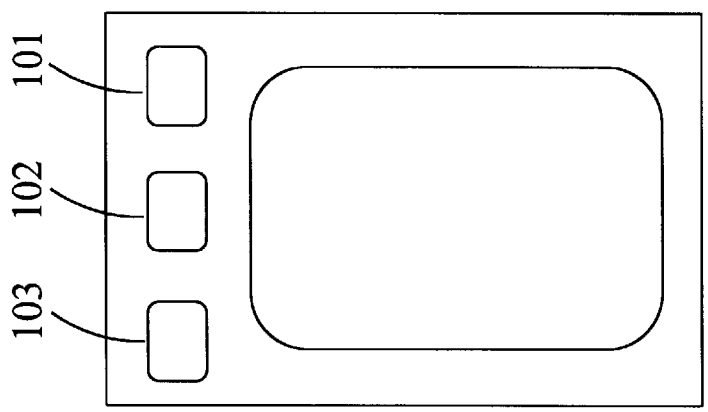
Figure 4A:
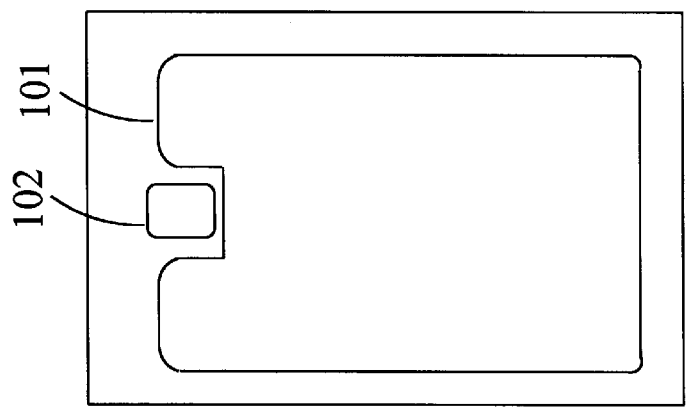

The power pack's ability to be stacked can be further enhanced by using a lid that does not have interface circuitry on-board. FIGS. 4a–4c illustrate a lid without interface circuitry. The lid in FIGS. 4a–4c is designed for use with a MOS controlled thyristor or IGBT. FIG. 4c illustrates the lid after the feedthrough holes are formed but before metalization. Hole 102 is formed to connect an MCT gate with gate driver circuitry. Hole 101 is formed for a gate return connection. Hole 103 is formed to allow voltage measurements through the lid. The remaining holes 100 are formed to provide a path for carrying the power current flowing through the MCT. The holes 100 can be arranged and sized to improve power pack performance. The spacing of the holes 100 can provide low mutual inductance. A relation for decreasing mutual inductance can be determined by solving for minimum distance (D) that reduces self inductance to 1% to 10% by using twin lead formula, $L=\ln((D-r)/r)*(ur)(u*l)/3.14)$, where "l" is hole length, "ur" is the relative permeability of the stacked material, "u" is the permeability of the material in free space, "D" is the variable distance between holes, and "r" is the radius of the inner holes. Current flowing between two vias, at distance D, are opposite in direction to form a 1% to 10% flux cancellation. Vias spaced at a distance D with current flowing in the same direction increases mutual inductance by 1% to 10%. Typical spacing for lid holes is approximated at about 80 mils inches for holes having approximately a radius of 0.000508 m, hole length of 0.000762 m, and $u=4*(3.14)*10^{-7}$. Accordingly, minimum hole (via) distance is a function of hole radius and hole length. Preferably the holes are formed at equal spacing. Finite Element Modeling (FEM) is another method for determining hole spacing. Two dimensional modeling of the lid structure, using the twin lead formula variables, can graphically display mutual flux coupling. FEM will facilitate the optimization of a low inductance lid design by allowing electrical simulation at various application current levels, dI/dt, hole spacing, hole size, lid thickness, and materials.

Another design consideration in hole spacing is resistance. The total power pack resistance is inversely proportional to the number of holes. A lid having low electrical resistance is preferable. Increasing the number of holes reduces lid resistance. The maximum number of holes is bounded by the minimum distance required for low mutual inductance and mechanical strength.

The metalization of the holes 100 can also be varied to improve power pack performance. The metalization may be varied to decrease lid resistance. FIG. 4a illustrates a perspective view of inner surface of a lid (attached to active area of semiconductor) after metalization and FIG. 4b illustrates a perspective view of the outer surface of a lid (attached to the power electrodes) after metalization. Multiple holes reduce lateral lid current flow, prevent current crowding on top and bottom of the metalized lid, and reduce inductive voltages induced in lid metalization. Further, lid resistance can be further reduced using solder plugs in the holes. In typical configurations, solder plugged holes (60/40) decrease resistance of copper holes by 30%. Typically, single hole resistance is better than 170 micro-ohms which is 100 times smaller than the series resistance of an MCT. The single hole resistance of the metalization and solder can be calculated by known methods using the dimensions of the hole area, length, and the resistivity of the materials. Inner surface metalization allows power device current to flow from power device metalization into short interface material (e.g., solder) and then into quality metalization (e.g., copper).

Figure 5:
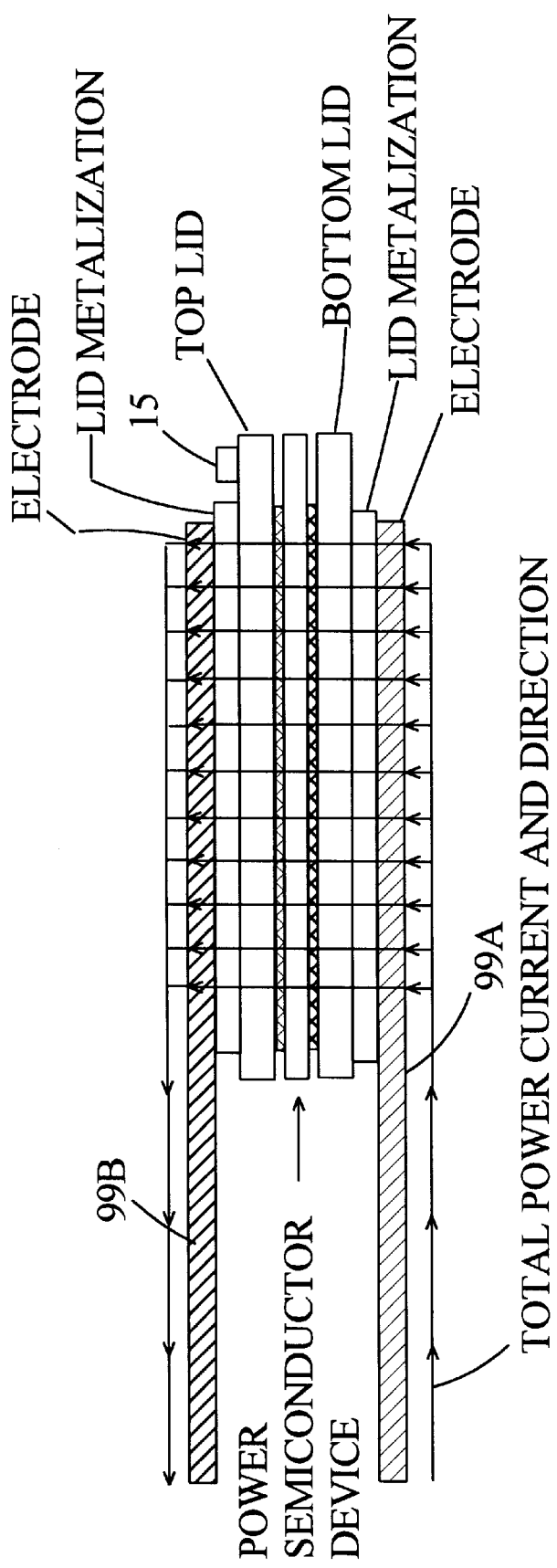
FIG. 5 illustrates an embodiment of the present invention having a stripline connection.

Further, lid inductance can be canceled by using stripline connections to the power pack. Ideally, the stripline cancels the majority self inductance between the lids and partially reduces the mutual inductance of the lid holes (vias). Preferably the angle of the load current flowing through the stripline is 180 degrees to and from the lid. FIG. 5 illustrates a power pack in operation with stripline connections 99.

Figure 6:
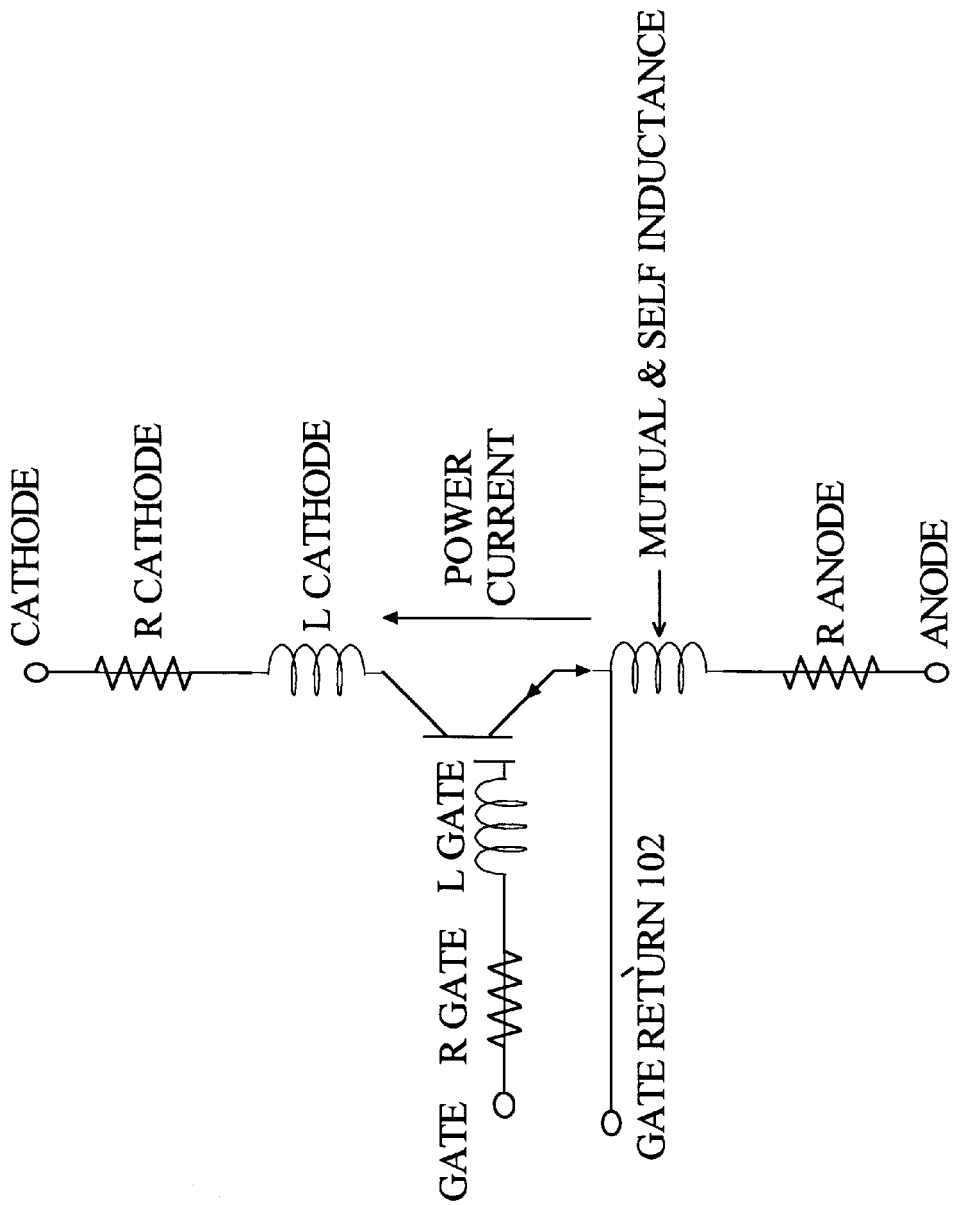
FIG. 6 illustrates an electrical power device model of an embodiment of the present invention.
Figure 7:
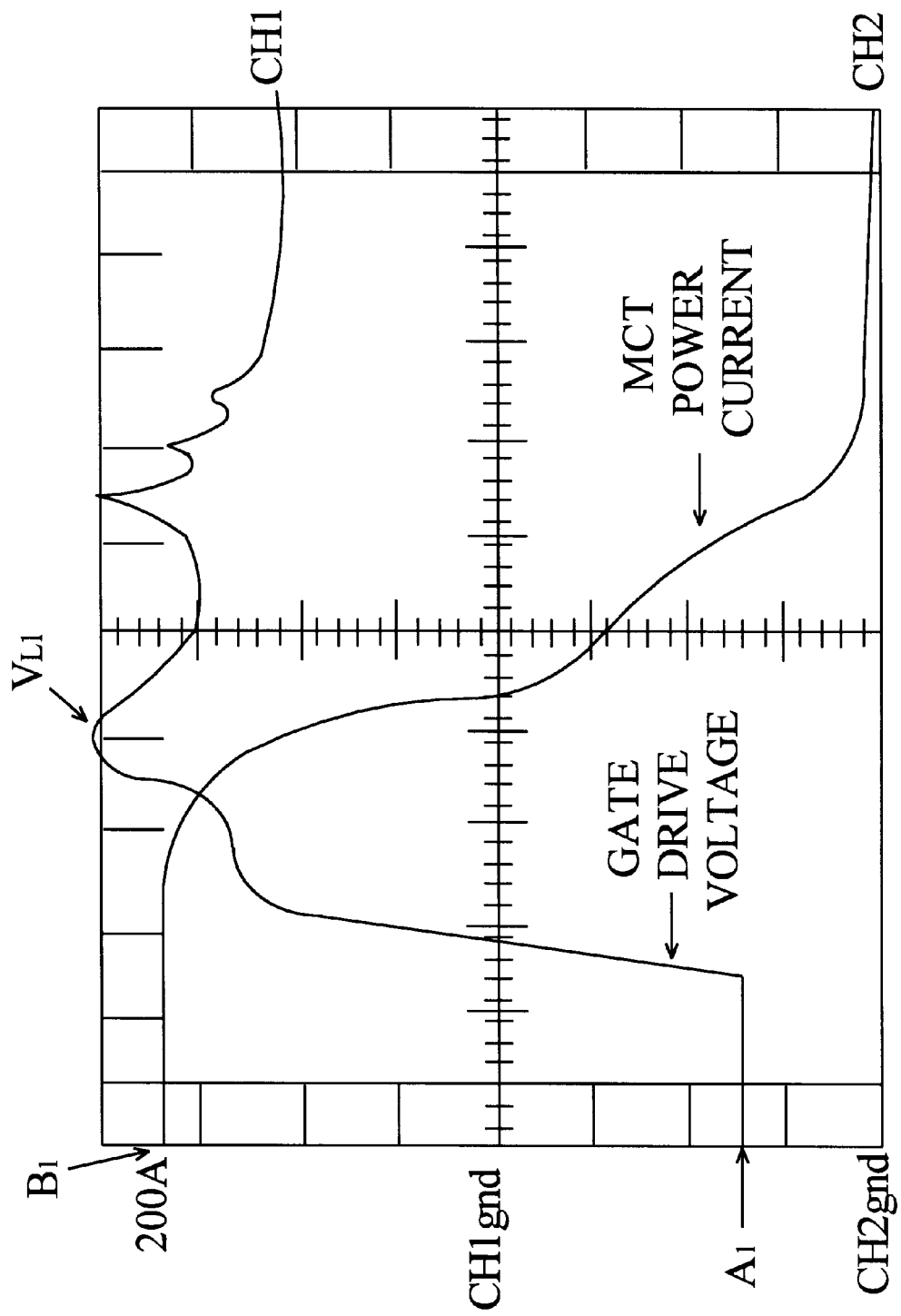
FIG. 7 illustrates a power pack "turn off" operation without a gate return and without stripline.
Figure 8:
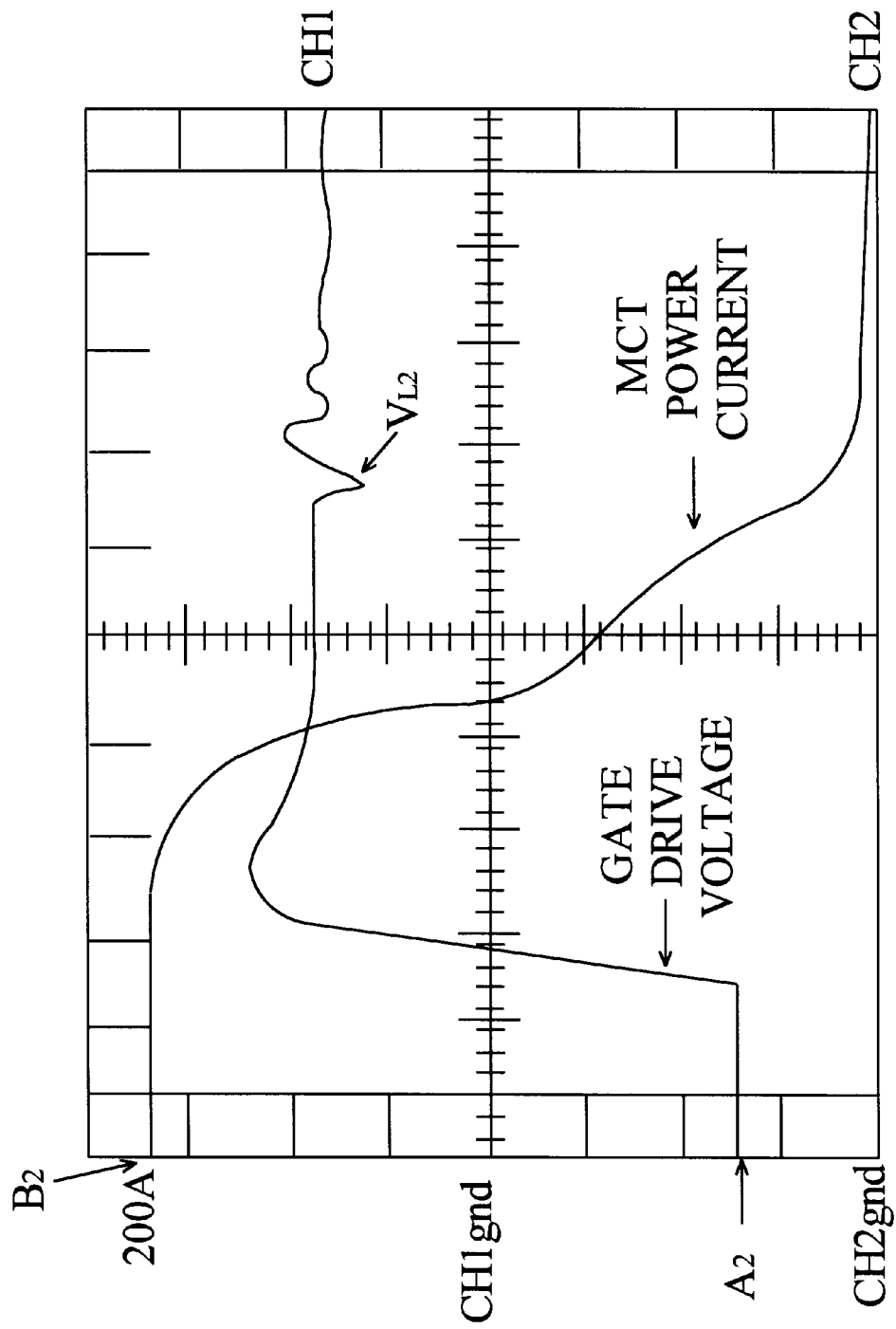
FIG. 8 illustrates the performance of the power pack without a gate return and with stripline inductance canceling.

The power pack of FIG. 5 further includes a gate and gate return contact 15. The position of the gate return is further illustrated in the power device model illustrated in FIG. 6. The gate return provides a bypass of inductive voltage (LdI/dt) between the top and bottom of the lid that is both series aiding and opposing with the gate drive voltage. During turn-on, the self and mutual inductance of the lid (about 0.5 nH) causes inductive voltages that are series opposing and during turn-off, the self and mutual inductance causes voltages that are series aiding (i.e., (Turn on=[Vgate−(0.5 nH)/30 KA/uS)] and (Turn Off=[Vgate+(0.5 nH)/30 KA/uS)]). The addition of a separate gate return allows a surge current rated power device (MCT) to operate at full dI/dt capability. Thus, the gate return bypasses the dangerous transient voltage that may over voltage the gate oxide (20V) or turn off the power switch while carrying kilo-amp load currents (switching outside the Safe Operating Area (SOA)). The gate return 101, as illustrated in FIG. 4a–4b, is connected from top via pad, separated from top lid metal to quality metal on under side of the lid with no solder bridges. The gate return improves gate drive reliability, extends di/dt operation of power device, and provides high di/dt "shoot through" current protection. FIG. 7 illustrates power pack "turn off" operation without a gate return and without stripline inductance cancellation and FIG. 8 illustrates the improved performance of the power pack without gate return (gate return referenced to the top of lid) and with stripline inductance canceling. Inductive noise voltage VL1, shown in waveform A1 of FIG. 7, is calculated by multiplying the lid inductance times the dI/dt of the power current in waveform B1 of FIG. 7. Lid inductance is calculated by dividing VL1 by the power current B1 dI/dt (L1=[3V/(100 A/400 nS)]=12 nH). Please note that the power current waveform B1 of FIG. 7 is not connected using stripline. FIG. 5 shows the power current applied through the bottom electrode 99A flowing to the base plate (left to right) and direction of current flow. Current flow through the power package (top and bottom lids and power device) is vertical and has a phase angle of 90 degrees with respect to the bottom electrode 99A current. Waveforms A1 and B1, of FIG. 7, show the disadvantage (increase in inductive noise voltage VL1 between the lids) of not completing the stripline connection in the power circuit. In FIG. 8, waveform A2 shows the absence of excessive noise VL2 in the gate drive voltage and the use of stripline connection. Stripline connection can be completed by attaching electrode 99B to top lid in FIG. 5 and forcing the current to flow at an angle of 180 degrees with respect to current flowing in electrode 99A (right to left). Lid inductance, of the striplined lid, is calculated by dividing VL2 by the power current B2 dI/dt (L2=[2V/(25 A/80 nS)]=0.64 nH). The gate voltage noise level is approximately 18.75 lower than the same lid geometry without stripline and is a significant improvement over prior art "ball", "duckfoot", and wire bonding. The inductive noise voltage is linear (LdI/dt) meaning that decreasing the lid inductance by a factor of 18.75 will allow a 18.75 increase in dI/dt if the power device allows it. The voltage of VL2, in FIG. 8, can be bypassed by the addition of a gate return that is attached to the bottom side of the lid metalization thus increasing the dI/dt capability of the package further. FIG. 6 shows a schematic with a gate return that bypasses mutual and self inductance. Power gate drive currents flowing through the gate driver, (FIG. 1, 30) to the power device 10 is now well distributed through the quality lid metalization on the bottom (FIG. 4A, 101) to the top side of the power device metalization (FIG. 1, 18) which forms a low resistance path to charge the power device gate. Also, stripline reduces the power loop inductance in the module which results in less forward blocking voltage during "turn off" and an increase in dI/dt in the module. The power loop inductance, illustrated in FIG. 6, can be calculated by the equation L=[(ur)(u)(l)(d)/w], where (w) is the lid width, (l) is length, (u) is permeability of free space, (ur) is relative permeability of the stacked materials (the total relative value between two lids and silicon die) and (d) is the distance between lids and silicon. A typical power loop inductance of 1.7 nH can be approximately calculated for the stripline structure in FIG. 5 by using values of: u=4*(3.14)*10$^{-7}$, l=0.00766 m, w=0.0108 m, d=0.0019 m. The structure of FIG. 5 is an order of magnitude better than bonding wire and adapts itself easily to low inductance circuitry outside the power package.

Figure 9:
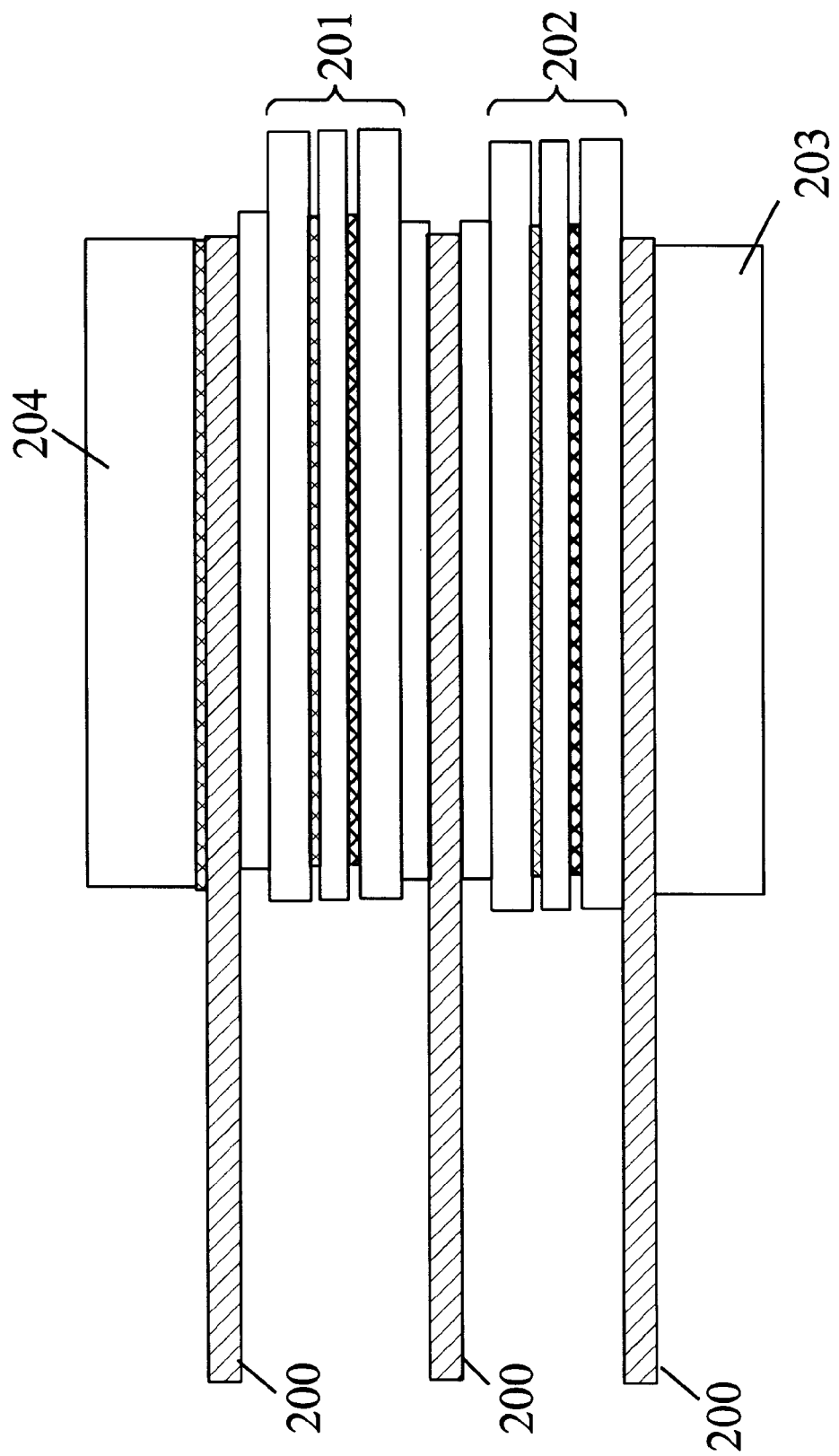
FIG. 9 illustrates a stacked power pack embodiment of the present invention implementing a half bridge circuit and top side cooling.
Figure 10:
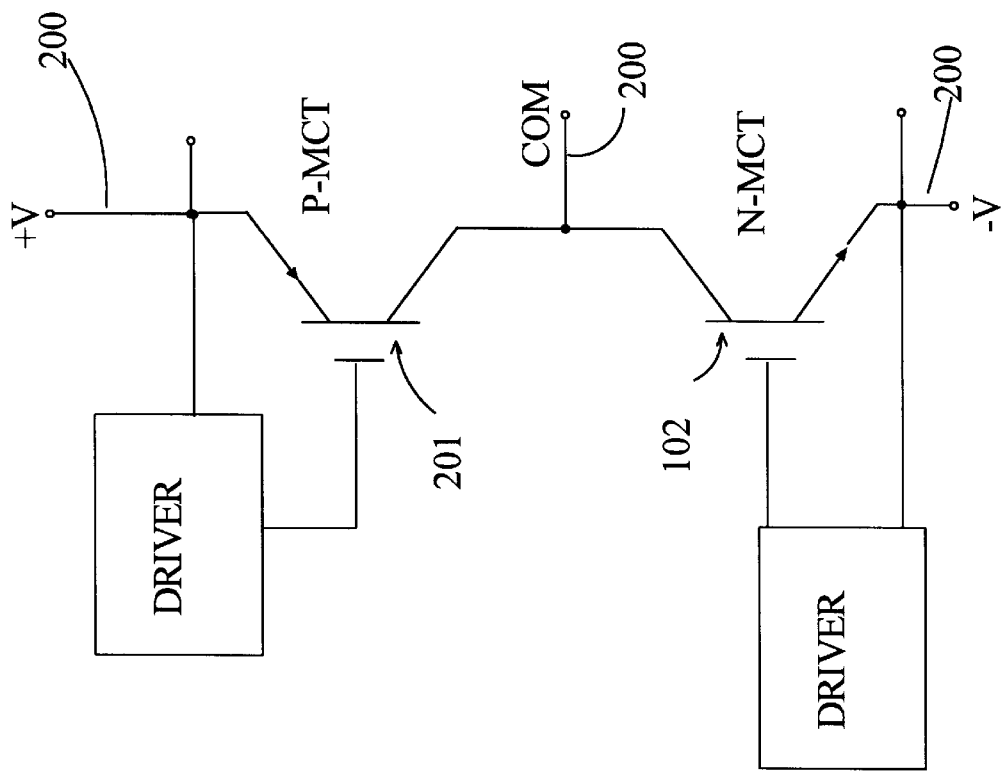
FIG. 10 illustrates a circuit diagram for the power pack of FIG. 9.

FIG. 9 illustrates one construction for a stacked power pack implementing a half bridge circuit. FIG. 10 is a circuit diagram illustrating the power pack of FIG. 9. Stripline 200 provides voltage and load lines. While power packs 201 and 202 provide switching capability to each half of the bridge circuit. Heat sinks 203 and 204 may also be implemented to provide improved top sided cooling. Stacked power pack can be series, parallel, or series parallel connected.

Figure 12:
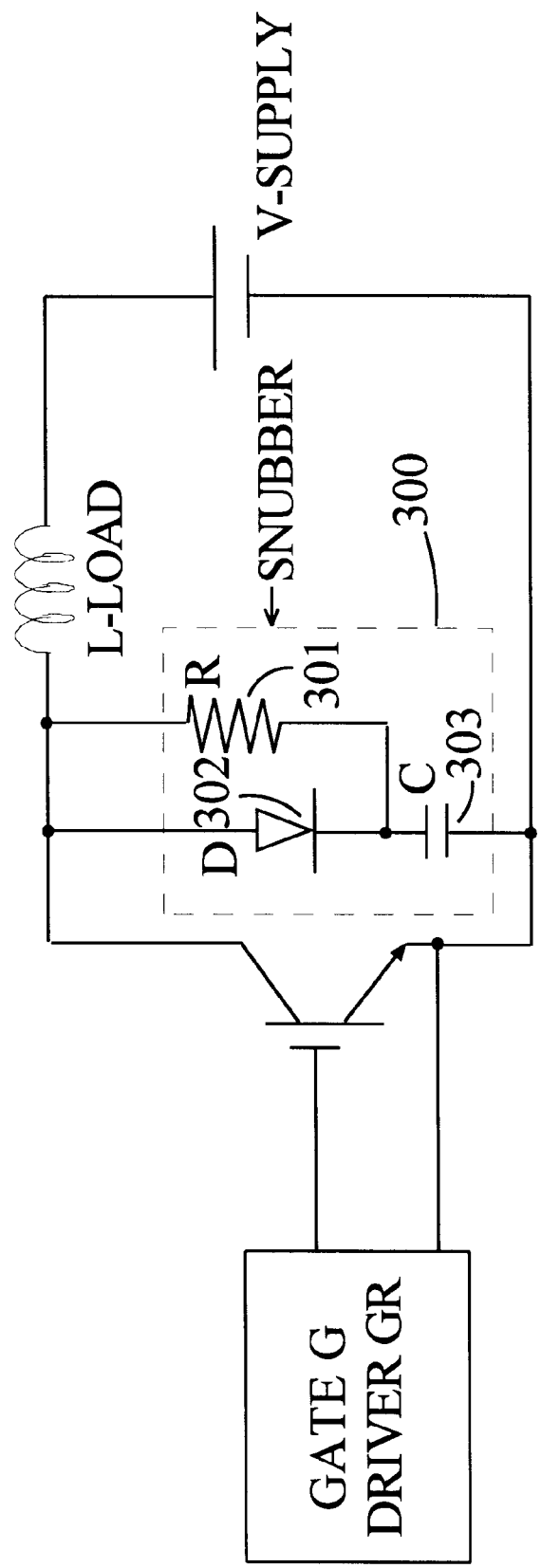
FIG. 12 illustrates a snubber circuit in a power circuit.
Figure 13:
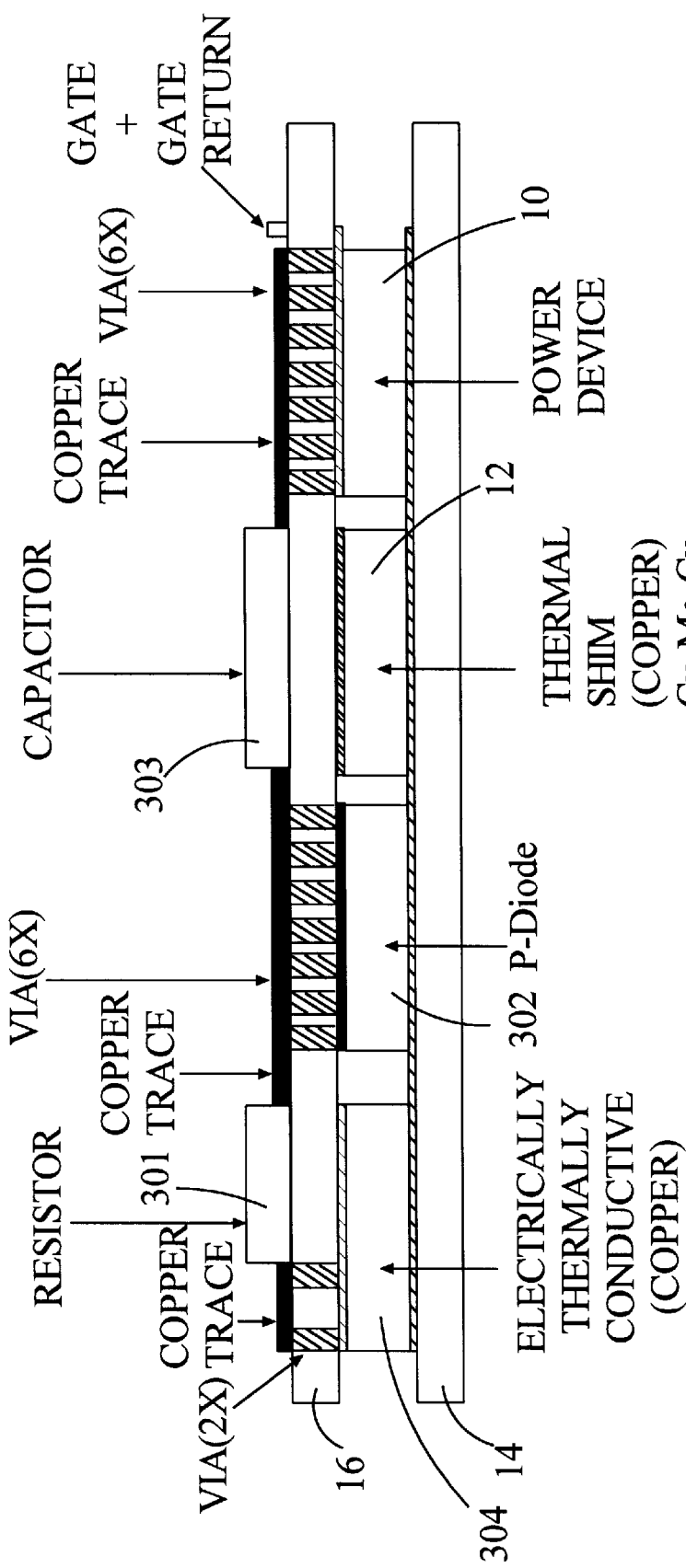
FIG. 13 illustrates a physical layout for an embodiment of the present invention.
Figure 14:
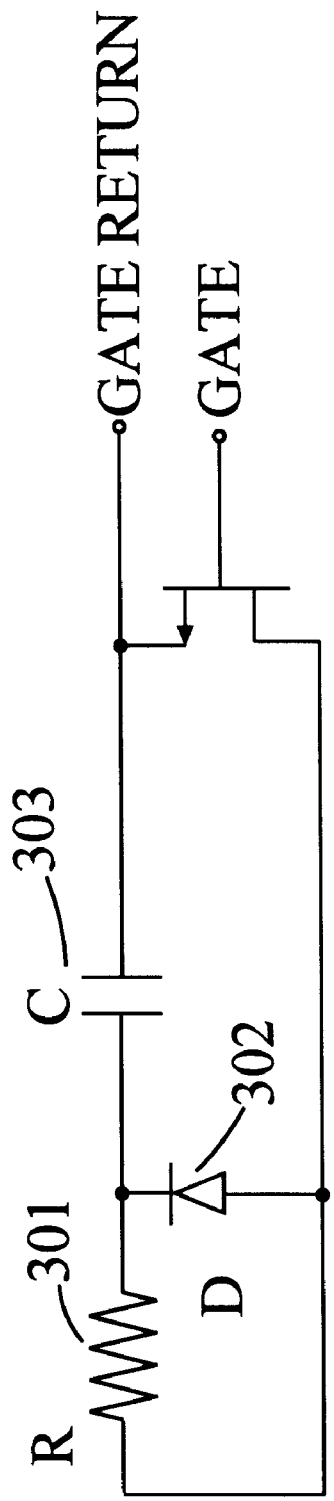
FIG. 14 illustrates circuit diagram of FIG. 13.

FIG. 13 illustrates an embodiment of the present invention which includes a snubber circuit. FIG. 12 provides a circuit illustration of a snubber in a power circuit. In FIG. 12, the snubber includes a resistor 301, a diode 302, and a capacitor 303. The snubber 300 aims to limit voltage spikes or stepped voltage from damaging the device during "Turn Off" when the load is primarily inductive. The snubber 300 extends the SOA of the power semiconductor by delaying the voltage rise across the power device while turning off current; this reduces the turn off energy of the power semiconductor. Snubbers are well known in the art. In FIG. 13, the snubber is integrated into the power pack. In FIG. 13, the resistor 301, capacitor 303, and power device 10 may be interconnected using copper trace and the metalized feedthrough holes. Additionally, an electrically and thermally conductive material 304 such as copper or Cu—Mo—Cu may be used for connecting circuit elements and providing a path for dissipating heat from the resistor 301 through lid 16 to base plate 14. The resistor 301 (and other resistors for the power pack) may be formed using a thick film, a thick film trace, or a discrete thick film resistor. The component thermal management, illustrated in snubber 300, also provides the ability to dissipate the power in bias and damping resistors for the power pack (not shown). The snubber may also be mounted inside a hermetic lid structure (see for example FIG. 11). A non-hermetic mount is preferred because of the ease of assembly and test. A snubber integrated into a power pack has a low inductance path to the power device and can be manufactured with short lead length or stripline. Low inductance snubbers, such as the snubber discussed above, are more effective across power devices because they reduce the switching energy of the device by holding down the voltage across the power device during turn off. FIG. 14, illustrates an electric equivalent circuit of the snubber integrated power pack of FIG. 13.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

We claim:

1. A thin power pack of the type having a flat power semiconductor device as a main switch and a thermal management system for providing at least two device cooling paths in opposing directions for the power semiconductor device, the improvement comprising a circuit permanently positioned in said power pack for driving said power semiconductor device, said circuit being thermally isolated from said power semiconductor device and having a circuit cooling path parallel to said device cooling paths.

2. The thin power pack of claim 1, wherein the power pack has large flat surfaces for stacking and for optimum thermal flow.

3. The thin power pack of claim 1, wherein the device cooling paths and circuit cooling path have low thermal resistance.

4. The thin power pack of claim 1, wherein the device and circuit cooling paths are comprised of ceramic.

5. The thin power pack of claim 1, wherein the circuit comprises an interface circuit for receiving and implementing power semiconductor device control commands.

6. The thin power pack of claim 1, wherein the power semiconductor device is hermetically sealed in the power pack.

7. The thin power pack of claim 1, wherein the circuit further comprises a thick resistive film for circuit connections.

8. A universal power pack for controlling the flow of energy comprising:
   a power semiconductor device for manipulating energy flow characteristics;
   a drive circuit for said power semiconductor device, said drive circuit thermally insulated from said power semiconductor device;
   a control circuit for controlling said drive circuit and for receiving simple commands;
   a power semiconductor device thermal management means for providing a first set of cooling paths for said power semiconductor device; and
   a drive circuit thermal management means for providing a second set of cooling paths for said drive circuit, said second set of cooling paths being parallel to said first set of cooling paths.

9. The universal power pack of claim 8, wherein said power semiconductor device is hermetically sealed in said pack.

10. The universal power pack of claim 8, wherein said power semiconductor device and drive circuit thermal management means are hermetically sealed.

11. The universal power pack of claim 8, further comprising one or more power semiconductor devices, each device having a corresponding drive circuit, control circuit, power semiconductor device thermal management means, and drive circuit thermal management means within said pack.

12. The universal power pack of claim 8, wherein each device operates independently.

13. The universal power pack of claim 8, wherein each control circuit and device has a separate path for the flow of energy and for receiving simple control commands.

14. A stackable power module of the type having a power semiconductor switch for high speed switching at high temperatures and having a first set of cooling paths, the improvement comprising semiconductor circuitry in said module for driving said power semiconductor switch, said circuitry having a cooling path parallel to said first set of cooling paths.

15. The stackable power module of claim 14, wherein said cooling path for said driver circuitry comprises a thermal shim.

16. The stackable power module of claim 14, further comprising a lid for said switch, wherein said circuitry and said shim are mounted on directly opposing sides of said lid.

17. The stackable power module of claim 16, wherein said lid comprises a ceramic substrate.

18. The stackable power module of claim 16, wherein said lid is a high temperature circuit board.

19. The stackable power module of claim 16, wherein said lid comprises feedthrough holes for connecting said circuitry to said switch.

20. The stackable power module of claim 16, wherein the coefficient of thermal expansion of said plate and lid are matching.

21. The stackable power module of claim 16, further comprising a base plate, said plate and lid forming a sandwich surrounding said shim and said switch.

22. The stackable power module of claim 21, wherein said plate is in contact with said power semiconductor switch.

23. The stackable power module of claim 16, further comprising a second lid as a base plate, said second lid and first lid forming a sandwich surrounding said shim and said switch.

24. The stackable power module of claim 16, further comprising a stripline connecter.

25. The stackable power module of claim 14, wherein the power semiconductor switch is hermetically sealed in the stackable power module.

26. A high speed switching power pack comprising a power semiconductor switch, a driver for the power semiconductor switch, a metalized and patterned ceramic lid, said power semiconductor switch and driver positioned on opposite sides of said lid, a base plate for encasing said power semiconductor switch in a sandwich between the plate and the lid, and a thermal conduit positioned within the sandwich and in contact with the lid and plate for providing a cooling path for the driver.

27. The high speed switching power pack of claim 26, wherein said plate, lid, and conduit have low thermal resistance.

28. The high speed switching power pack of claim 26, wherein said lid is a high temperature circuit board.

29. The high speed switching power pack of claim 26, wherein said plate and said lid each provide a separate cooling path for said switch.

30. The high speed switching power pack of claim 26, wherein said thermal conduit provides a cooling path to said plate for said driver.

31. The high speed switching power pack of claim 26, wherein said switch is mounted on said lid and is in contact with said plate.

32. The high speed switching power pack of claim 31, wherein said plate and lid have matching coefficients of thermal expansion to the power semiconductor.

33. The high speed switching power pack of claim 26, wherein said lid comprises hermetically sealed feedthrough paths for connecting said switch to said driver.

34. A power pack of the type having a power semiconductor switch, a base plate for mounting the switch, a lid for sealing an area including said switch between the lid and the plate and for providing switch interconnect paths, the switch having the lid as a first cooling path and the base as a second cooling path, the improvement comprising an integrated circuit for driving the switch, said integrated circuit mounted on an area of the lid outside of the area sealed between the lid and the plate, and a thermal shim positioned inside the area sealed between the lid and the plate, said shim being in contact with the plate and with the lid in an area opposite to the integrated circuit, the thermal shim providing a cooling path to the plate for the integrated circuit.

35. The power pack of claim 34, wherein said pack is hermetic.

36. The power pack of claim 34, wherein said lid is a high temperature circuit board.

37. The power pack of claim 34, wherein said lid is comprised of a copper patterned ceramic substrate.

38. The power pack of claim 34, wherein said plate is comprised of a copper-molybdenum-copper composite.

39. The power pack of claim 34, wherein said plate is comprised of a material matching the expansion coefficient of said lid.

40. The power pack of claim 34, wherein said lid comprises feedthrough holes for connecting said power semiconductor switch to said integrated circuit.

41. The power pack of claim 40, wherein said power semiconductor switch and thermal shim are hermetically sealed between said lid and said plate.

42. A stackable thin power pack of the type having a power semiconductor device for controlling the flow of electrical energy, a base plate, and a ceramic lid having metalized paths for connecting the pack to external equipment, the device being sealed in between the base plate and the lid, the improvement comprising a high frequency and high power integrated circuit for driving the power semiconductor device, the integrated circuit positioned on said lid opposite to said device and connected to the device through metalized paths, a thermal shim sealed in between the lid and base plate, the shim physically isolated from the device, and the shim providing a cooling path to the plate for the integrated circuit.

43. The stackable thin power pack of claim 42, wherein the lid and the plate each provide a cooling path for the power semiconductor device.

44. The stackable thin power pack of claim 43, wherein the cooling paths for the power semiconductor device are parallel to the cooling path for the integrated circuit.

45. The stackable thin power pack of claim 42, wherein the metalized paths are solder plugged.

46. The stackable thin power pack of claim 42, wherein the plate is comprised of a material matching the expansion coefficient of the lid.

47. The stackable thin power module of claim 42, wherein the lid is a high temperature circuit board.

48. A method of manufacturing a flat power pack having a power semiconductor device, base plate, lid, and thermal shim comprising the steps of:

(a) forming a metalized and patterned path through the lid;

(b) providing circuitry for interfacing with the semiconductor device;

(c) affixing interface circuitry to the lid;

(d) forming alignment areas in the base plate for holding the thermal shim and power semiconductor device;

(e) soldering metal under the power semiconductor device 10 and the thermal shim 12;

(f) positioning both solder tinned power semiconductor device and thermal shim in alignment areas;

(g) assembling the power pack by aligning and stacking the lid with the base plate by the interface circuitry aligned with the thermal shim and the metalized path aligned and in contact with the power semiconductor device;

(h) slide the assembled module on a hot plate; and (i) slide the heated assembly off the hot plate for cooling.

49. The method of claim 48, wherein the step of forming a metalized and patterned path through the lid comprises the steps of:

(a) providing an oxide ceramic substrate;

(b) depositing metal on the ceramic substrate by electroless plating;

(c) depositing metal on the electroless plated metal using electroplating;

(d) forming gas release openings on the electroplated metal to prevent blistering; and (e) process the substrate with a direct bond copper profile.

50. A power pack for high speed high temperature power electronics comprising:

a flat power semiconductor device for switching power current;

a flat top lid made of a low thermal resistance material, said lid having metalized holes and metalized upper and lower surfaces for channeling power current during power pack operation; and a flat bottom plate having an electrical path for the power semiconductor device, said device being bonded directly to the lower surface of the lid and the upper surface of the base plate, the lid, device, and plate forming a three layer stack with the device as the middle layer.

51. The power pack of claim 50, wherein the flat top lid comprises a gate return path to the power semiconductor device.

52. The power pack of claim 50, wherein the flat top lid comprises a voltage measurement path to the power semiconductor device.

53. The power pack of claim 50, wherein the power pack is connected to external equipment with flat cables.

54. The power pack of claim 50, wherein the power pack includes a stripline connection path.

55. The power pack of claim 50, wherein the power semiconductor device is hermetically sealed between the lid and plate.

56. The power pack of claim 50, wherein the metalized holes are positioned to minimize mutual inductance and minimize resistance.

57. The power pack of claim 50, wherein the diameter of the metalized holes are formed and the distance between the holes minimize the lid's mutual inductance and resistance.

58. The power pack of claim 50, wherein the metalized holes are solder plugged providing lower lid resistance.

59. The power pack of claim 50, wherein the power pack is stacked with a second power pack with facing lids.

60. The power pack of claim 50, further comprising a stripline connection path for both the flat top lid and the flat bottom plate and wherein the flat top lid and the flat bottom plate each have a wide surface and a small thickness for reducing inductance during power pack operation.

61. The power pack of claim 50, further comprising a snubber.

62. The power pack of claim 61, wherein the snubber is integrated with the power semiconductor device.

63. The power pack of claim 61, further comprising a resistor.

64. The power pack of claim 63, further comprising a material positioned between the flat top lid and the flat bottom lid providing a thermal dissipation and electrical conduction path for the resistor.

65. The power pack of claim 63, wherein the resistor is formed using a thick film, a thick film trace, or a discrete thick film resistor.

66. The power pack of claim 61, wherein the power semiconductor device and snubber are hermetically sealed between the lid and the plate.

67. The power pack of claim 50, further comprising a first flat stripline current conduction path to the flat top lid, a second flat stripline current conduction path to the flat bottom plate, the metalized holes providing a first feedthrough current conduction path through the flat top lid to the flat power semiconductor device, and a second feedthrough current conduction path through the flat bottom plate to the flat power semiconductor device.

68. The power pack of claim 67, wherein the second feedthrough current conduction path comprises metalized holes.

69. The power pack of claim 68, wherein the first stripline current conduction path is connected to the first feedthrough current conduction path and the second stripline current conduction path is connected to the second feedthrough current conduction path.

70. The power pack of claim 69, wherein the current through all of the conduction path minimizes the self and mutual inductance of the power pack.

71. The power pack of claim 70, wherein current through the first stripline current conduction path flows in a direction directly opposite to current through the second stripline current conduction path and current through the first and second feedthrough conduction paths flows perpendicular to current through the first and second stripline conduction paths to minimize the self and mutual inductance of the power pack.

72. The power pack of claim 51 further comprising a gate path to the power semiconductor device.

73. The power pack of claim 51 further comprising a passive damping resistor in the gate return path for dissipating power.

74. The power pack of claim 72 further comprising a passive damping resistor in the gate path for dissipating power.

75. The power pack of claim 73, wherein the passive damping resistor is formed using a thick film, a thick film trace or a discrete thick film resistor so as to have a surface area sufficient for dissipating power.

76. The power pack of claim 74, wherein the passive damping resistor is formed using a thick film, a thick film trace or a discrete thick film resistor so as to have a surface area sufficient for dissipating power.

77. The power pack of claim 50 wherein a frame is positioned around the power semiconductor device and in between the lid and plate for hermetically sealing the power semiconductor device.

78. The power pack of claim 77 wherein a first flat plate is affixed to the flat top lid and a second flat plate is affixed to the flat bottom plate.

79. The power pack of claim 77 wherein the first and second plates are electrically conductive.

80. A power module for converting available electric power to required voltage and current values comprising a plurality of thin flat power packs stacked and aligned, each of the flat power packs having paths to allow combined operation of the power packs.

81. The power module of claim 80, further comprising stripline connectors for providing an electric power path to the power packs.

82. The power module of claim 80, wherein each power pack comprises a gate return to bypass gate inductance.

83. The power module of claim 80, wherein the power packs are hermetically sealed.

84. The power module of claim 80, further comprising a heat sink.

85. The power module of claim 80, wherein each power pack includes a driver circuit.

86. The power module of claim 80, wherein each power pack includes an interface circuit.

87. The power module of claim 80 wherein each thin flat power pack comprises a flat lid having a top and a bottom surface and each thin flat power pack comprising a power semiconductor device attached to the bottom of the lid which is controlled using a gate.

88. The power module of claim 87 wherein each power pack comprises a gate return to the bottom of the lid to bypass series inductance of the gate.

89. The power module of claim 87, wherein each power pack comprises a gate reference to the top of the lid and uses a stripline connection to each lid to reduce series gate inductance for each power pack.

* * * * *